(12) United States Patent
Chen et al.

(10) Patent No.: US 9,785,730 B2
(45) Date of Patent: Oct. 10, 2017

(54) SIMULATED LOADING METHOD AND APPARATUS FOR MOVING LOAD OF WHOLE TRAIN IN RAIL TRANSPORTATION

(71) Applicant: ZHEJIANG UNIVERSITY, Hangzhou (CN)

(72) Inventors: Yunmin Chen, Hangzhou (CN); Xuecheng Bian, Hangzhou (CN); Hongguang Jiang, Hangzhou (CN); Jianqun Jiang, Hangzhou (CN); Chong Cheng, Hangzhou (CN); Renpeng Chen, Hangzhou (CN); Xiang Xu, Hangzhou (CN); Wanfeng Jin, Hangzhou (CN)

(73) Assignee: ZHEJIANG UNIVERSITY, Zhejiang (CN)

(*) Notice: Subject to any disclaimer, the term of this patent is extended or adjusted under 35 U.S.C. 154(b) by 437 days.

(21) Appl. No.: 14/298,569

(22) Filed: Jun. 6, 2014

(65) Prior Publication Data

US 2014/0288903 A1 Sep. 25, 2014

Related U.S. Application Data

(63) Continuation of application No. PCT/CN2013/080409, filed on Jul. 30, 2013.

(30) Foreign Application Priority Data

Dec. 26, 2012 (CN) .......................... 2012 1 0573702

(51) Int. Cl.
G06F 17/50 (2006.01)
E01B 35/12 (2006.01)
G01M 17/08 (2006.01)

(52) U.S. Cl.
CPC .......... *G06F 17/5009* (2013.01); *E01B 35/12* (2013.01); *G01M 17/08* (2013.01)

(58) Field of Classification Search
USPC ........................................... 703/2, 6; 73/570
See application file for complete search history.

(56) References Cited

U.S. PATENT DOCUMENTS

| 5,591,915 A | * | 1/1997 | Theurer | .................. E01B 35/00 |
| | | | | 104/10 |
| 8,464,527 B2 | * | 6/2013 | Gerber | ...................... E02B 9/08 |
| | | | | 60/495 |
| 9,127,998 B1 | * | 9/2015 | Guldiken | ................ G01L 5/246 |

FOREIGN PATENT DOCUMENTS

| CN | 102108656 A | 6/2011 |
| CN | 201901828 U | 7/2011 |

(Continued)

OTHER PUBLICATIONS

Chinese First Examination Report of corresponding Chinese Application No. 201210573702.X, dated Feb. 27, 2014.

(Continued)

*Primary Examiner* — Thai Phan
(74) *Attorney, Agent, or Firm* — J.C. Patents

(57) ABSTRACT

The present invention discloses a simulated loading method and an apparatus for moving load of a whole train in rail transportation. Multiple actuators are arranged above rail sleepers along rail direction. The rail is cut into separate rail segments, which are connected to rail sleepers via fastening systems. Based on a verified train-rail-subgrade theory model, the distribution of fastener force under the movement of a train bogie can be obtained. A simplified expression of this solution can be acquired by Gauss function fitting considering the train axle load, which is used as the input load of actuators. Each actuator performs the same dynamic excitation sequentially with a time interval along the train (Continued)

moving direction. Therefore, moving load of different vehicle types at different train speeds can be simulated. The present invention provides a reliable and convenient test method and an apparatus for research of developing infrastructures of rail transportation.

6 Claims, 4 Drawing Sheets

(56) References Cited

FOREIGN PATENT DOCUMENTS

| | | | |
|---|---|---|---|
| CN | 202170458 U | 3/2012 |
| CN | 102650574 A | 8/2012 |
| CN | 103015280 A | 4/2013 |
| CN | 103063451 A | 4/2013 |
| CN | 203101071 U | 7/2013 |
| CN | 103063451 B | 7/2014 |
| JP | 2002-30642 A | 1/2002 |
| JP | 2003-322586 A | 11/2003 |
| RU | 142551 A1 | 9/1998 |
| SU | 142551 A1 | 9/1988 |

OTHER PUBLICATIONS

Chinese International Search Report of corresponding International PCT Application No. PCT/CN2013/080409, dated Nov. 7, 2013.

* cited by examiner

SIMULATED LOADING METHOD AND APPARATUS FOR MOVING LOAD OF WHOLE TRAIN IN RAIL TRANSPORTATION

CROSS-REFERENCE TO RELATED APPLICATIONS

This application is a continuation of International Application No. PCT/CN2013/080409, filed on Jul. 30, 2013, which claims priority to Chinese Patent Application No. 201210573702.X, filed on Dec. 26, 2012, both of which are hereby incorporated by reference in their entireties.

FIELD OF THE TECHNOLOGY

The present invention relates to a loading method and an apparatus for a load, in particular relates to a simulated loading method and an apparatus for moving load of a whole train in rail transportation.

BACKGROUND

Rail transportation is developing rapidly in China. High-speed railway and inter-city railway as well as light rail and subway are all under rapid construction. However, with the construction and operation of rail transportation facilities, more and more engineering problems appear. Dynamic stability of the subgrade under train load affects safe operation of the train; vibration of the rail and the subgrade created by interaction between wheels and rail also significantly affects the environment and human's daily life. With the increasing train speed of high-speed railway, interaction between the train and the rail becomes more severe. When the speed of the train reaches a critical wave velocity of the soil, Mach effect will appear, which seriously threatens the safe operation of the train. The train load is transmitted to the structure under the rail via interaction between the wheel axle and the rail. Compared with conventional fixed-point cyclic loading, the interaction between the wheel axle and the rail typically has moving effect and speed effect. As the train moves, each structure layer under the rail experiences a same loading procedure along the moving direction of the train. This loading characteristic is quite different from the fixed-point loading, which results in that the rail structure and the subgrade structure represent different dynamic performance. Therefore, achieving an effective simulation of load moving process of the whole train is significant to the research in actual dynamic performance of the rail transportation infrastructure.

SUMMARY

The objective of the present invention is to provide a simulated loading method and an apparatus for moving load of a whole train in rail transportation, which can be used to realize the high-speed moving process of the train and study the moving effect and speed effect created by train moving load.

In order to achieve the above objective, the technical solution adopted by the present invention is:

1. A simulated loading method for moving load of a whole train in rail transportation, including the following steps:

Step 1: Based on a verified train-rail-subgrade theory model, the distribution of fastener force along the longitudinal direction of track under the movement of a train bogie can be obtained. A simplified expression of this theoretical solution can be acquired by function fitting considering the train axle load P. The supporting force of the fastening system can be expressed as:

$$y = PA\left(e^{-\frac{x^2}{2\omega^2}} + e^{-\frac{(x-a)^2}{2\omega^2}}\right),$$

where A=34.30, ω=0.79 are fitting parameters, x is the distance between the fastening system and the position of the train wheel, y is a supporting force of the fastening system under the rail, a is the distance between two wheels in a train bogie.

Step 2: The supporting force of the fastening system can be further expressed as a function of time t by taking train speed v into account:

$$y = PA\left(e^{-\frac{(vt)^2}{2\omega^2}} + e^{-\frac{(vt-a)^2}{2\omega^2}}\right);$$

Step 3: Two continuous rails are connected to sleepers via the fastening systems. The spacing between two adjacent fastening systems is Δs, which is in accordance with the spacing specified by the design standards of high-speed railway. Then the two rails are cut into multiple pairs of discrete independent rail segments right above the rail sleeper. The connection properties between the rail and the rail sleeper remain unchanged.

Step 4: A distribution beam is located right above each pair of rail segments in Step 3. An actuator is bolted to the top surface of the distribution beam. The fastener force-time history curve acquired in Step 2 is adopted as a load excitation curve of each actuator.

Step 5: The load excitation curve of each actuator in Step 4 is the same. A time interval Δt exists between the load excitation curves of adjacent actuators, which is determined by spacing Δs of the adjacent fastening systems and train speed v:

$$\Delta t = \frac{\Delta s}{v}.$$

Step 6: Each actuator performs the same dynamic excitation sequentially with the time interval Δt along the moving direction of the whole train. Therefore, the moving load of different vehicle types at different train speeds can be simulated.

The rear bogie of a carriage and leading bogie of the immediately following carriage combine to give a typical load event. The simulated moving load of the whole train can be considered as the combination of N such events.

The fitting function in Step 1 is a Gauss function.

The fastener force-time history curve in Step 2 is an "M"-shape wave curve, which is consistent with the real load caused by a train.

2. An apparatus for moving load of a whole train in rail transportation:

Multiple actuators of the present invention are arranged above each rail sleeper of high-speed railway along rail direction. The top of each actuator is connected to the bottom center of a transverse reaction beam. Two ends of each transverse reaction beam are fixed on two longitudinal reaction beams, two ends of which are connected with two supporting pillars. The bottom of each supporting pillar is fixed on the ground.

The bottom of each actuator is connected to the top center of a distribution beam by four high-strength bolts. The bottom of the two ends of the distribution beam is mounted right above two rails. The two continuous rails are connected to the rail sleepers via fastening systems and are cut into discrete independent rail segments right above the rail sleeper. The rail sleepers locate on a roadbed and underlying subgrade.

The present invention has the following advantages:

(1) A fastener force-time history curve under the movement of a train bogie is acquired by Gauss function fitting on the basis of the train-rail-subgrade theory model. (2) The fastener force-time history curve is an "M"-shape wave curve, which is consistent with the real load caused by a train. (3) The fastener force-time history curve is applied to separate rail segments with a time interval between adjacent actuators along the train running direction. The moving load of different vehicle types at different train speeds can be simulated without adopting a real train model. (4) A long road section for accelerating train speed is no longer needed, and the size of the indoor test model is reduced. This invention provides a reliable and convenient loading platform for experimental study of the rail transportation.

In the figures: 1—actuator, 2—distribution beam, 3—high-strength bolt, 4—fastening system, 5—rail, 6—rail sleeper, 7—roadbed, 8—subgrade, 9—transverse reaction beam, 10—longitudinal reaction beam, 11—supporting pillar.

DETAILED DESCRIPTION

The present invention is described below in further detail with reference to the accompanying drawings and embodiments.

Figure 1:
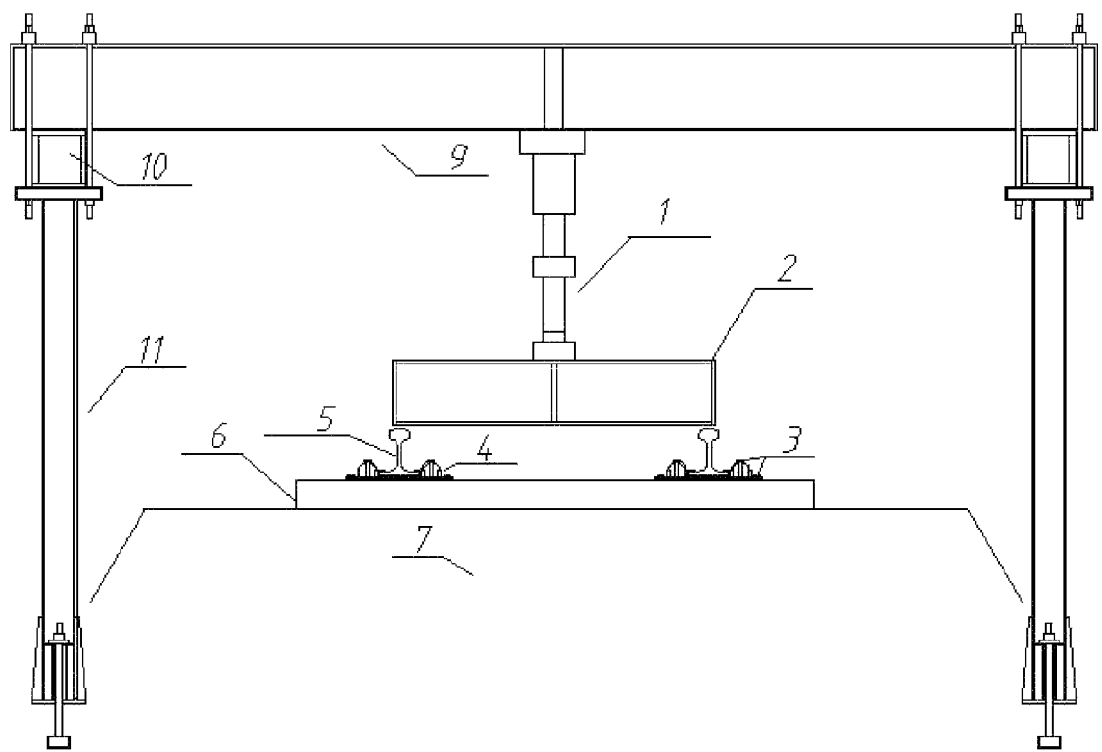
FIG. 1 is a transverse schematic diagram of the apparatus of the present invention.
Figure 2:
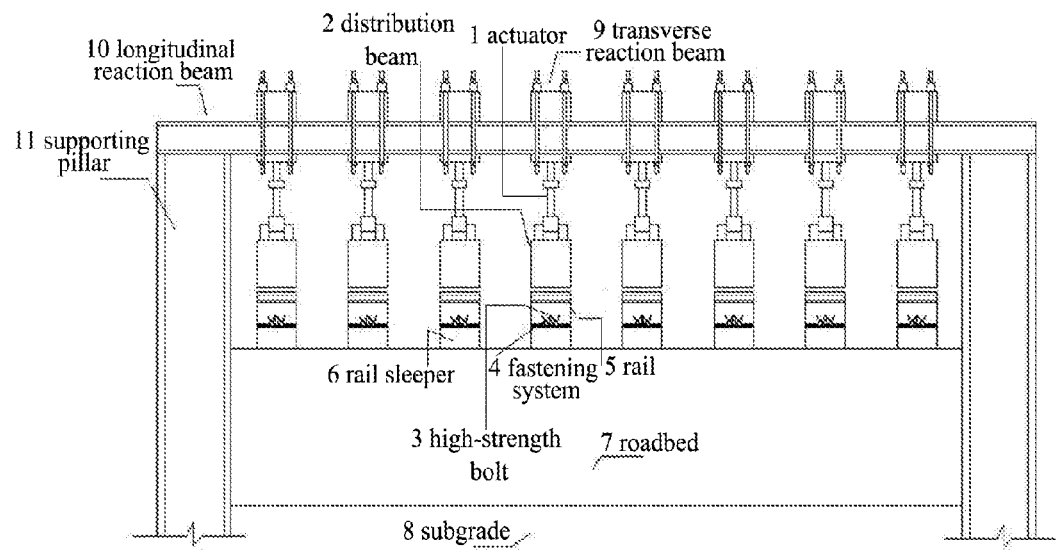
FIG. 2 is a longitudinal schematic diagram of the apparatus of the present invention.
Figure 3:
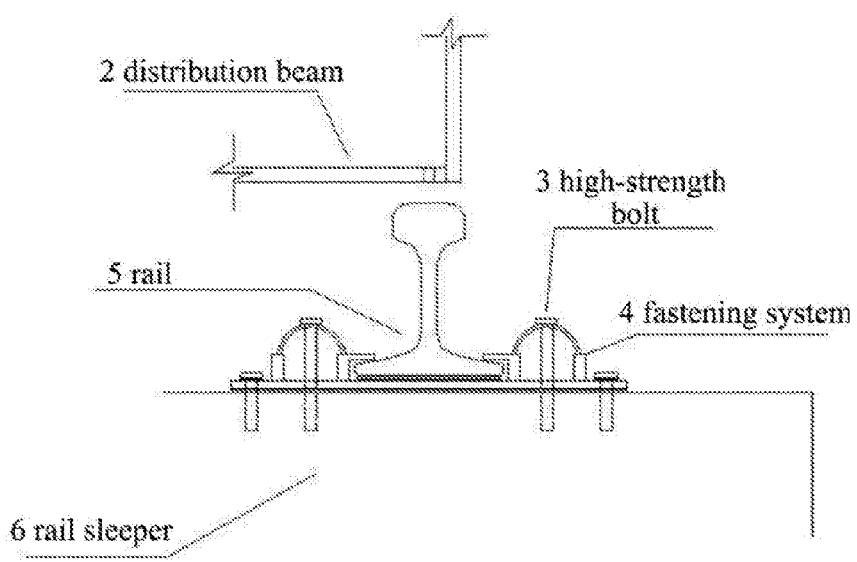
FIG. 3 is a transverse schematic diagram of connection of a rail segment.
Figure 4:
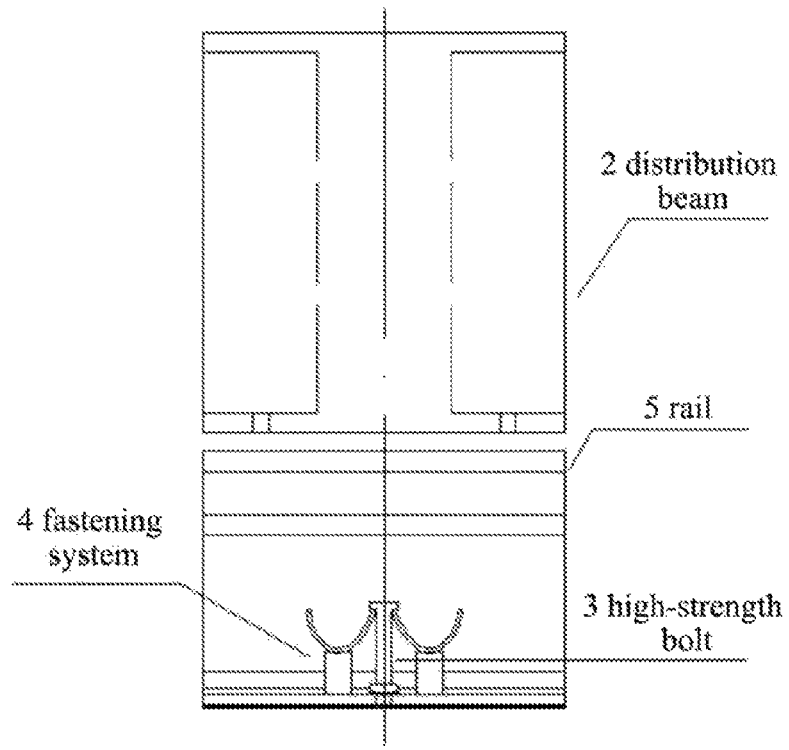
FIG. 4 is a longitudinal schematic diagram of connection of a rail segment.

The present embodiment is performed on the simulated loading apparatus for moving load of a whole train in rail transportation shown in FIG. 1 and FIG. 2. A ballasted railway structure is adopted. CHN60-type rail 5 is connected to III-type reinforced concrete rail sleeper 6 via WJ-7-type fastening system 4. Roadbed 7 is composed of roadbed surface layer and roadbed bottom layer. The roadbed surface layer is filled with graded gravel, and the roadbed bottom layer is filled with A/B fillings. Totally eight actuators 1 are adopted and located right over eight rail sleepers 6 along rail direction with the spacing of Δs=0.630 m. The top of each actuator 1 is connected to the bottom center of a transverse reaction beam 9. Two ends of each counter-force transverse beam 9 are fixed on two longitudinal reaction beams 10, two ends of which are connected with two supporting pillars 11. The bottom of each supporting pillar 11 is fixed on the ground. The bottom of each actuator 1 is connected to the surface center of a distribution beam 2 by four high-strength bolts 3. The bottom of the two ends of the distribution beam 2 is mounted right above two rails 5. The two continuous rails 5 are fixed on the rail sleeper 6 and are cut into discrete rail segments 5 with length of 0.3 m. Each pair of rail segments 5 are connected to the rail sleeper 6 by two fastening systems 4, as shown in FIG. 3 and FIG. 4. The rail sleepers 6 locate on a roadbed 7 and underlying subgrade 8.

Figure 5:
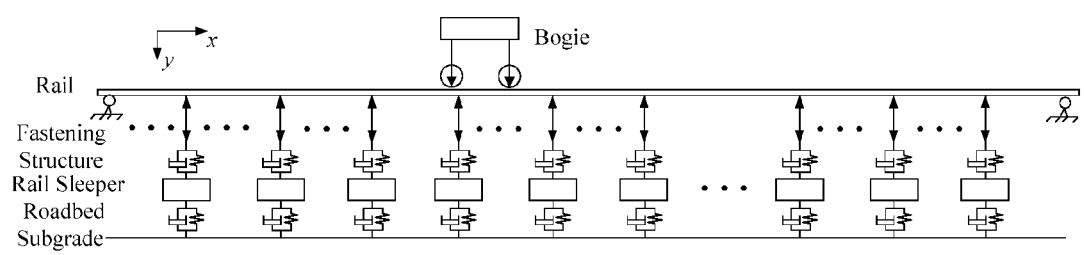
FIG. 5 is a theory schematic diagram of train-rail-subgrade theory model under movement of the whole train.

A plane structure assumption of the train-rail-subgrade theory model under movement of the the whole train is shown in FIG. 5, which is composed of the train bogie, rail 5, fastening system 4, rail sleeper 6, roadbed 7 and subgrade 8. The rail 5 adopts Euler-beam assumption, and is assumed as a simply supported beam. The discrete distributed rail sleeper 6 is assumed as a mass block. Both of the fastening system 4 and the roadbed 7 adopt viscoelastic spring assumption, wherein the roadbed 7 is a distributed spring and damping. The dynamic force caused by the interaction between train bogie and the rail 5 under the moving train is supported by the fastening systems 4 which distribute under the rail 5.

A CRH3-type train with axle load P=15t and moving speed v=18 km/h is adopted. The spacing between two wheels of a same bogie is only 2.5 m, and the spacing between adjacent bogies of the front and rear carriages is 7.5 m. Since the influencing range of a single wheel axle is about 5 m, it is reasonable to use a single bogie to represent the real train load considering the superposition of the influence of the wheel load. Based on a verified train-rail-subgrade theory model, the distribution of fastener force along the longitudinal direction of track under the movement of a train bogie can be obtained. A simplified expression of this solution can be acquired by Gauss function fitting considering the train axle load P. The supporting force of the fastening system can be expressed as:

$$y = PA\left(e^{-\frac{x^2}{2\omega^2}} + e^{-\frac{(x-a)^2}{2\omega^2}}\right),$$

where A=34.30, ω=0.79 are fitting parameters, x is the distance between the fastening system and the position of the train wheel, y is a supporting force of the fastening system of the rail, a is the distance between two wheels in a train bogie.

Assuming that the initial position of the train wheel axle is at the position of the supporting pillar, the supporting force of the fastening system can be further expressed as a function of time t by taking train speed v into account:

$$y = PA\left(e^{-\frac{(vt)^2}{2\omega^2}} + e^{-\frac{(vt-a)^2}{2\omega^2}}\right).$$

Figure 6:
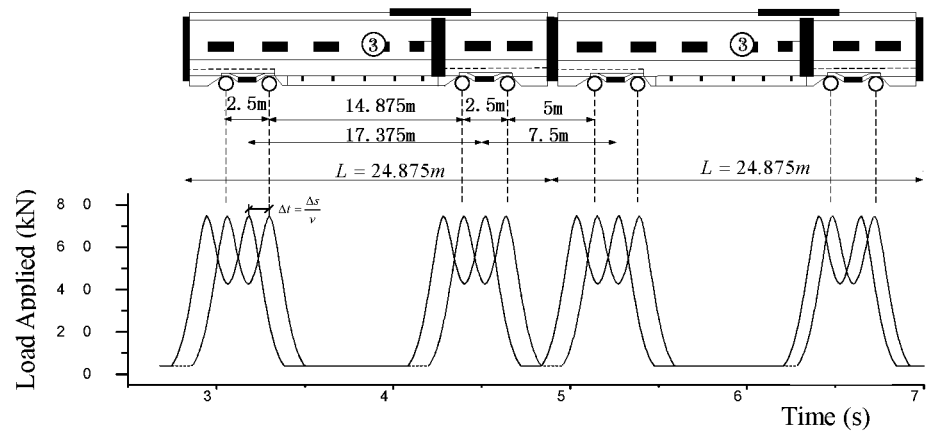
FIG. 6 is a schematic diagram of fastener force-time history curve under movement of the whole train.
Figure 7:
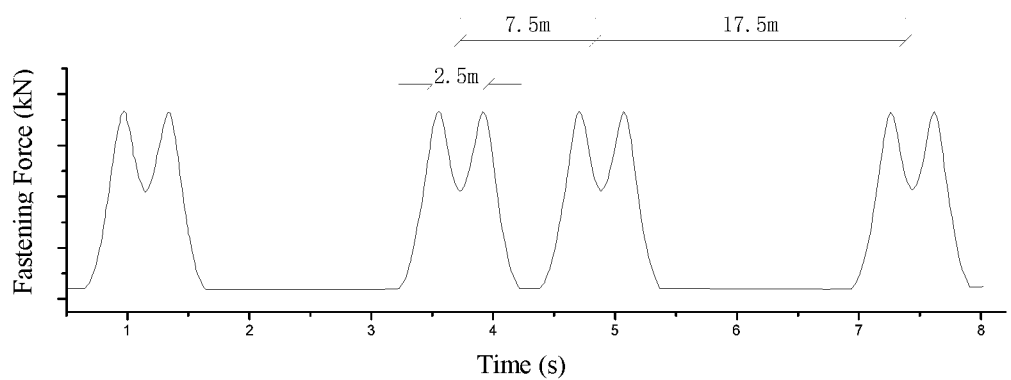
FIG. 7 is a load excitation curve of an actuator.

Since there exists a load superposition phenomenon caused by two wheels in a train bogie, the fastener force-time history curve shapes like the letter of "M" under the movement of train bogie, as shown in FIG. 6, which is consistent with the real load of the train. The curve is regarded as the load excitation curve of each actuator shown in FIG. 7.

The load excitation curves of actuators are the same. A time interval Δt exists between the load excitation curves of adjacent actuators, which is determined by spacing Δs of the adjacent fastening systems and train speed v. Take spacing Δs=0.630 m and train speed at 18 km/h as an example, the time interval Δt can be expressed as:

$$\Delta t = \frac{\Delta s}{v} = 0.126 \text{ s},$$

Actuators perform the same dynamic excitation sequentially with the time interval Δt along the moving direction of the whole train. Therefore, the moving load of different vehicle types at different train speeds can be simulated.

What is claimed is:

1. A simulated loading method for a moving load of a whole train in rail transportation, characterized by comprising the following steps:
    step 1: by function fitting based on a verified train-rail-subgrade theory model and using train wheel axle load P, an expression of force distribution of a fastening system along a longitudinal direction of track under the movement of a train bogie is obtained, wherein supporting force of the fastening system is expressed as:

$$y = PA\left(e^{\frac{x^2}{2\omega^2}} + e^{-\frac{(x-a)^2}{2\omega^2}}\right);$$

where A=34.30, ω=0.79 are fitting parameters, x is a distance between the fastening system and a position of a train wheel, y is a supporting force of the fastening system of the rail, a is a distance between two wheels in the train bogie;
    step 2: the supporting force y of the fastening system is further expressed as a function of time t by taking train speed v into account where x=vt, to obtain a force-time history expression:

$$y = PA\left(e^{\frac{(vt)^2}{2\omega^2}} + e^{-\frac{(vt-a)^2}{2\omega^2}}\right);$$

step 3: two continuous rails are connected to rail sleepers via fastening systems, where a spacing between two adjacent fastening systems is Δs, which is determined in accordance with design standards of high-speed railway, and then the two continuous rails are cut into multiple pairs of discrete independent rail segments right above the rail sleepers, while ensuring that connection properties between the rail and the rail sleeper remain unchanged;
    step 4: a distribution beam is located right above each pair of the discrete independent rail segments in step 3, and an actuator is connected to a top surface of the distribution beam, then the force-time history expression acquired in step 2 is adopted as a load excitation curve of each actuator;
    step 5: the load excitation curve for each actuator in step 4 is the same, and there is a time interval Δt between exciting adjacent actuators, which is determined by the spacing Δs of the adjacent fastening systems and the train speed v:

$$\Delta t = \frac{\Delta s}{v};$$

step 6: each actuator performs a dynamic excitation sequentially at the time interval Δt along a moving direction of the whole train, thus moving loads of different vehicle types at different train speeds are simulated.

2. The simulated loading method for a moving load of a whole train in rail transportation according to claim 1, wherein: the simulated moving load of the whole train is a combination of multiple such events representing multiple bogies of the whole train.

3. The simulated loading method for a moving load of a whole train in rail transportation according to claim 1, wherein: the function in step 1 is a Gauss function.

4. The simulated loading method for a moving load of a whole train in rail transportation according to claim 1, wherein: the force-time history expression in Step 2 is an "M"-shape curve, which is consistent with a real load caused by the train bogie.

5. An simulated loading apparatus for a moving load of a whole train in rail transportation according to the loading method of claim 1, wherein: multiple actuators are arranged above each rail sleeper of high-speed railway along rail direction, a top of each actuator is connected to a bottom center of a transverse reaction beam, two ends of each transverse reaction beam are fixed on two longitudinal reaction beams, two ends of each longitudinal reaction beam are connected with two supporting pillars, a bottom of each supporting pillar is fixed on the ground.

6. The simulated loading apparatus for a moving load of a whole train in rail transportation according to the loading method of claim 1, wherein: a bottom of each actuator is connected to a top center of the distribution beam by four high-strength bolts, bottoms of two ends of the distribution beam are mounted right above the two continuous rails, the two continuous rails are connected to the rail sleepers via fastening systems and are cut into discrete independent rail segments right above the rail sleepers, the rail sleepers are located on a roadbed and underlying subgrade.

* * * * *